(12) United States Patent
Chang et al.

(10) Patent No.: US 8,304,665 B2
(45) Date of Patent: Nov. 6, 2012

(54) PACKAGE SUBSTRATE HAVING LANDLESS CONDUCTIVE TRACES

(75) Inventors: Chiang-Cheng Chang, Taichung Hsien (TW); Yen-Ping Wang, Taichung Tsien (TW); Don-Son Jiang, Taichung Hsien (TW); Jeng-Yuan Lai, Taichung Hsien (TW); Yu-Po Wang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 608 days.

(21) Appl. No.: 12/266,674

(22) Filed: Nov. 7, 2008

(65) Prior Publication Data

US 2009/0283303 A1   Nov. 19, 2009

(30) Foreign Application Priority Data

May 16, 2008 (TW) ................ 97117970 A

(51) Int. Cl.
*H05K 1/11* (2006.01)
*H05K 1/09* (2006.01)
*H01R 9/00* (2006.01)

(52) U.S. Cl. ........ 174/262; 174/257; 174/263; 174/264; 174/265; 174/266; 361/773; 361/774

(58) Field of Classification Search .......... 174/262–266, 174/257; 361/792–795, 773, 774
See application file for complete search history.

(56) References Cited

U.S. PATENT DOCUMENTS

| | | | | |
|---|---|---|---|---|
| 3,566,461 A * | 3/1971 | Carbonel | ......................... | 29/604 |
| 4,543,715 A * | 10/1985 | Iadarola et al. | ................. | 29/852 |
| 6,891,272 B1 * | 5/2005 | Fjelstad et al. | ................. | 257/774 |
| 7,034,544 B2 * | 4/2006 | Ye et al. | ......................... | 324/534 |
| 7,098,407 B2 * | 8/2006 | Kim et al. | ....................... | 174/257 |
| 2002/0179332 A1 * | 12/2002 | Uematsu et al. | .............. | 174/262 |
| 2004/0212971 A1 * | 10/2004 | Iguchi | ............................ | 361/780 |
| 2005/0133251 A1 * | 6/2005 | Chiu | .............................. | 174/259 |
| 2005/0247482 A1 * | 11/2005 | Nakamura | ..................... | 174/262 |
| 2006/0108143 A1 * | 5/2006 | Hsu et al. | ....................... | 174/255 |
| 2006/0130321 A1 * | 6/2006 | Kwong et al. | .................. | 29/852 |
| 2006/0237227 A1 * | 10/2006 | Zhao et al. | ..................... | 174/262 |
| 2007/0194431 A1 * | 8/2007 | Corisis et al. | ................. | 257/698 |
| 2009/0224376 A1 * | 9/2009 | Choi et al. | ..................... | 257/659 |

FOREIGN PATENT DOCUMENTS

JP           11-008475        1/1999

* cited by examiner

*Primary Examiner* — Timothy Thompson
*Assistant Examiner* — Sherman Ng
(74) *Attorney, Agent, or Firm* — Peter F. Corless; Steven M. Jensen; Edwards Wildman Palmer LLP

(57) ABSTRACT

A package substrate having landless conductive traces is proposed, which includes a core layer with a plurality of plated through holes formed therein, and a plurality of conductive traces formed on at least a surface of the core layer. Each of the conductive traces has a connection end, a bond pad end, and a base body connecting the connection end and the bond pad end, the conductive trace is electrically connected to a corresponding one of the plated through holes through the connection end, and the connection end has a width greater than that of the base body but not greater than the diameter of the plated through hole, thereby increasing the contact area between the conductive trace and the plated through hole and preventing the contact surface of the conductive trace with the plated through hole from cracking.

12 Claims, 5 Drawing Sheets

PACKAGE SUBSTRATE HAVING LANDLESS CONDUCTIVE TRACES

BACKGROUND OF THE INVENTION

1. Field of the Invention

The present invention relates generally to package substrates, and more particularly to, a package substrate having landless conductive traces for electrically connecting plated through holes.

2. Description of Related Art

In conventional semiconductor package substrates applied in electronic devices, through holes such as plated through holes (PTH), vias or blind vias as disclosed by Japan Patent No. 11-008475 are formed to penetrate the substrate so as to reduce the length of the electrical conducting path to thereby improve electrical performance of highly integrated chips.

FIG. 1 is a diagram partially showing a circuit and a through hole of a conventional substrate. As shown in FIG. 1, a through hole 101 is formed to penetrate a substrate 100, and a circuit 110 is formed on a surface of the substrate 100 and the side wall of the through hole 101 by electroplating. The circuit 110 in the through hole 101 is formed with an opening 111 with a diameter of 200 μm. An insulating layer 120 is formed on the substrate 100 and the circuit 110 and filled in the opening 111. However, in the conventional fabrication process of through holes, the through hole 101 has a diameter S1 of about 300 μm and the opening 111 has a diameter S2 of about 200 μm, while the circuit 110 has a width S3 of only about 30 μm. There is a predetermined spacing between the two centers of any two adjacent through holes 101 that allows a certain number of circuits 110 to pass through. When the number of I/O connections is increased, the predetermined spacing between the two centers of any two adjacent through holes 101 is reduced, thereby reducing the number of circuits 110 allowable to pass therethrough.

To overcome the above-described drawback, as shown in FIGS. 2A and 2B, which are sectional and perspective diagrams of circuits and through holes of another conventional substrate, a through hole 201 is formed to penetrate the substrate 200, a conductive material 230 is filled in the through hole 201 and a circuit 210 is formed on the substrate 200 and the conductive material 230. Then, an insulating layer 220 is formed on the substrate 200 and the circuit 210. That is, the conductive material 230 is directly filled in the through hole 201 such that the conductive material 230 has a width equal to that of the through hole 201, which is about 200 μm. Thus, in the case the spacing between the two centers of any two adjacent through holes 201 is the same as that of the structure of FIG. 1, the number of circuits 210 allowable to pass therethrough is increased since the conductive material 230 is directly filled in the through hole 201 and has a smaller outer periphery.

However, the circuit 210 is formed by a wet etching process through a chemical reaction between the etchant of strong acid or alkali and molecules on surface of the metal layer to be etched away. Since the wet etching is an isotropic etching and requires a long-time contact of the upper surface of the conductive material 230 with the etchant, the upper surface of the conductive material 230 is apt to being over-etched and deformed, as shown in FIG. 2C. Further, in a subsequent thermal cycling test (TCT), thermal stresses are easy to generate due to high temperature environment or great variation of temperature, thereby causing crack of the contact surface 202 between the conductive material 230 and the circuit 210, as shown in FIG. 2D. In addition, as the circuit 210 has a smaller width, the crack can easily extend from one side of the contact surface 202 to the other side, which further results in separation of the circuit 210 from the conductive material 230 and thereby adversely affecting the product reliability. Furthermore, the end points of the circuit 210 is usually formed with right angles and thus stresses easily concentrate on the end points and corners 203 between the conductive material 230 and the circuit 210, as shown in FIG. 2E.

Therefore, how to provide a circuit structure for a semiconductor package substrate to overcome the above-described drawbacks has become a critical issue for the industry.

SUMMARY OF THE INVENTION

According to the above drawbacks, the present invention provides a package substrate having landless conductive traces for preventing stress concentration and separation of the conductive traces so as to improve the product reliability.

The present invention provides a package substrate having landless conductive traces, which at least comprises: a core layer having a first surface and a second surface, a plurality of plated through holes being formed in the core layer and penetrating the first and second surfaces; and a plurality of conductive traces formed on the first surface of the core layer, wherein each of the conductive traces has a connection end, an opposed bond pad end and a base body connecting the connection end and the bond pad end, the connection end is connected to a corresponding one of the plated through holes such that the conductive trace can be electrically connected to the corresponding one of the plated through holes, the width of the connection end is greater than the width of the base body but not greater than the diameter of the plated through hole so as to allow the connection end to be located within the end of the plated through hole.

The process for fabricating the package substrate of the present invention mainly comprises forming at least one plated through hole in a core layer, and forming a plurality of conductive traces on surface of the core layer, allowing each of the conductive traces to have a connection end, an opposed bond pad end, and a base body connecting the connection end and the bond pad end, and having the connection end be located within an end of a corresponding one of the plated through holes such that the conductive traces can be electrically connected to the plated through holes. Meanwhile, the connection end has a width greater than the width of the base body but not greater than the diameter of each of the plated through holes so as to allow the connection end to be located within the area of the end of each of the plated through holes. Therefore, by the predetermined width and area relations between the conductive trace, the connection end of the conductive trace and the plated through hole, the contact area between the conductive trace and the plated through hole is increased, thereby preventing cracking of the contact surface of the conductive trace with the plated through hole caused by thermal stresses in subsequent temperature cycles, such as a thermal cycling test (TCT) and further preventing the separation of the conductive trace from the plated through hole to thereby improve the product reliability. Meanwhile, as the connection end has a shape free from any angle, stress is prevented from being concentrated at corners as in the prior art.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention may also be implemented and applied according to other embodiments, and the details may be modified based on different views and applications without departing from the spirit of the invention.

Figure 1:
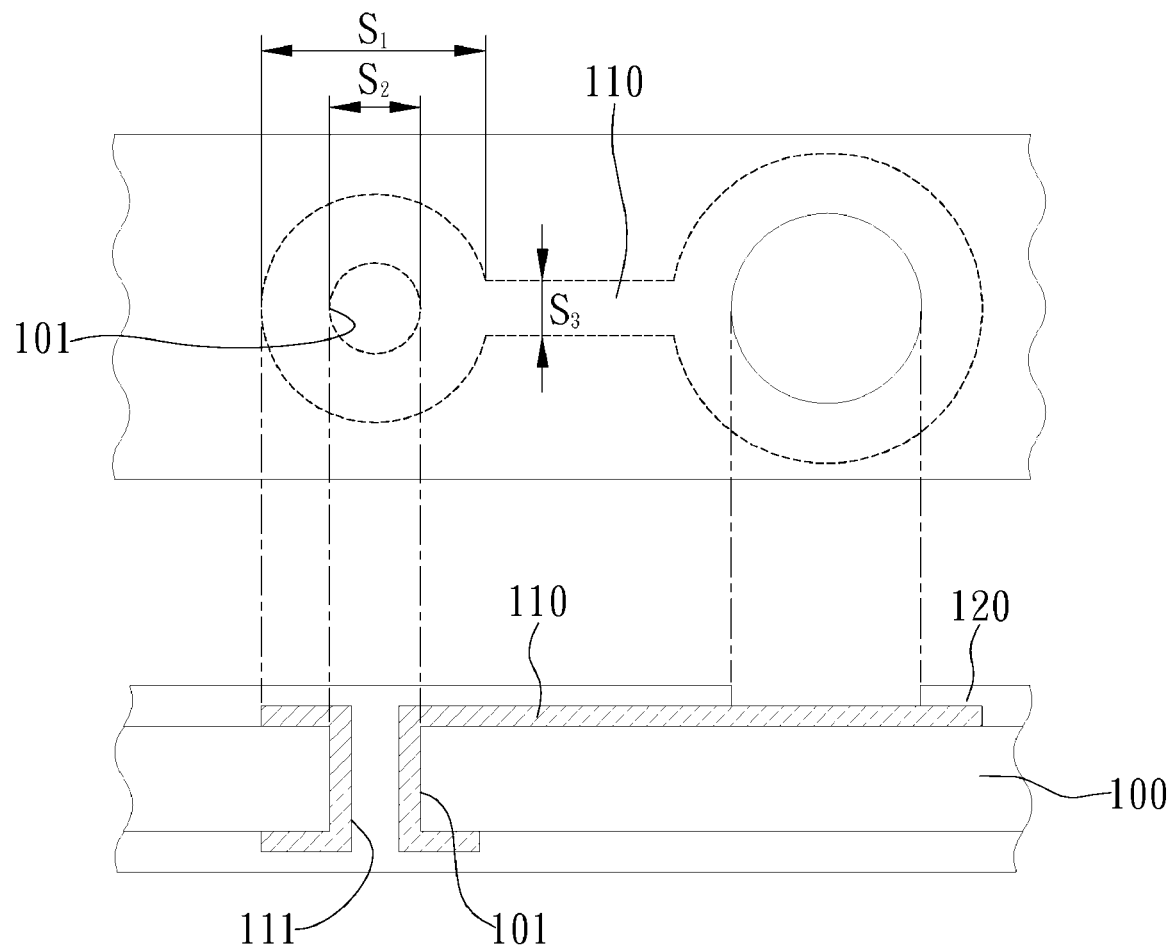
FIG. 1 is a diagram partially showing circuits and through holes of a conventional substrate.
Figure 2A:
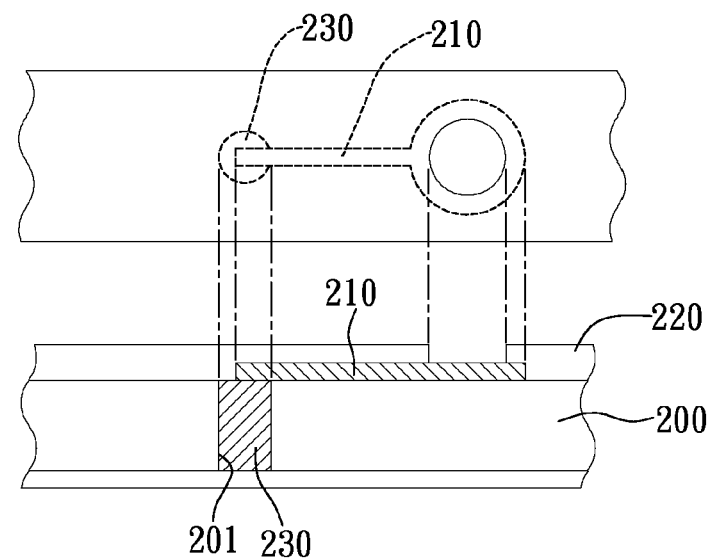
FIGS. 2A to 2E are diagrams showing a circuit and a through hole of another conventional substrate.
Figure 2B:
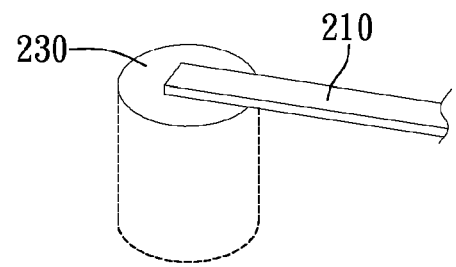
Figure 2C:
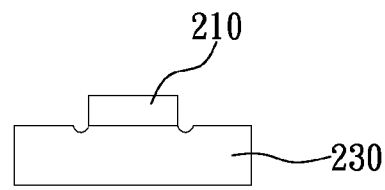
Figure 2D:
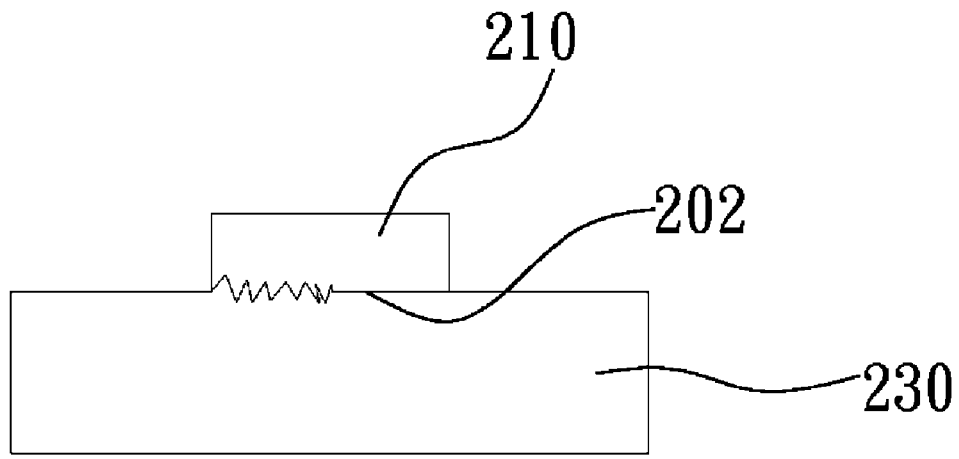
Figure 2E:
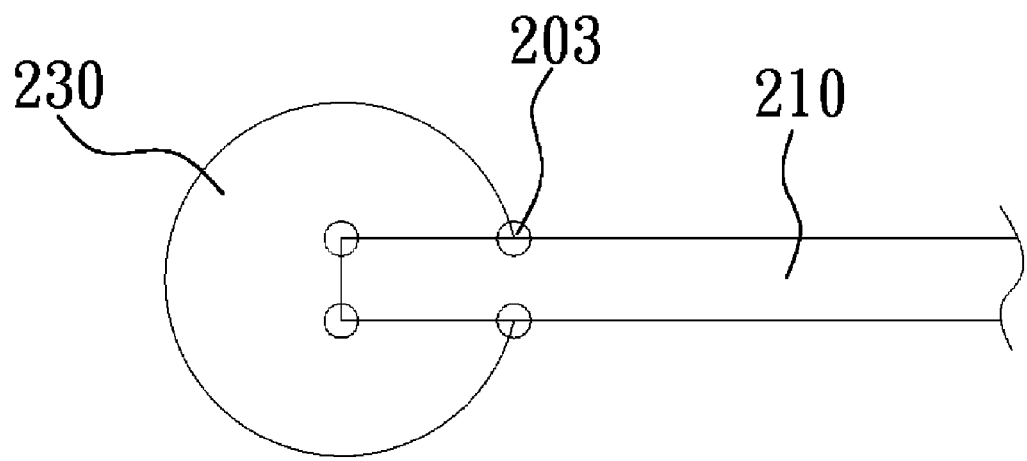
Figure 3A:
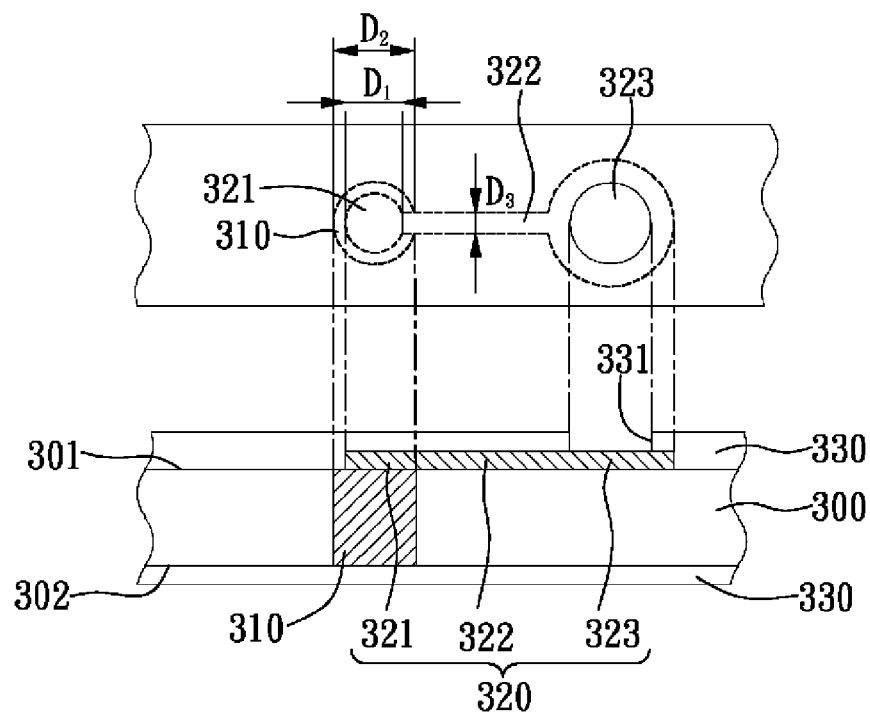
FIG. 3A shows a top view and sectional view of a package substrate having landless conductive traces according to a first embodiment of the present invention.

FIG. 3A shows a top view and sectional view of a package substrate having landless conductive traces according to a first embodiment of the present invention. The package substrate having landless conductive traces according to the present invention is formed by a core layer 300 having plated through holes 310 formed therein, and a plurality of conductive traces 320 formed on surface of the core layer 300 and having connection ends 321 through which the conductive traces 320 are electrically connected to the plated through holes 310. The present invention is characterized in that by regulating width and area relations between the conductive traces 320, the connection ends 321 of the conductive traces 320 and the plated through holes 310, the contact area between the conductive traces 320 and the plated through holes 310 is increased and the problem of stress concentration is alleviated.

The core layer 300 has a first surface 301 and a second surface 302. At least a plated through hole 310 is formed to penetrate the first surface 301 and the second surface 302 of the core layer 300 by laser drilling, for example. Further, a conductive material made of metal or alloy is filled in the plated through hole 310.

The conductive traces 320 are formed on the first surface 301 of the core layer 300, which can be made of a material selected from the group consisting of Cu, Sn, Ni, Cr, Ti, Cu—Cr alloy and Sn—Pb alloy. Each of the conductive traces 320 has a connection end 321, an opposed bond pad end 323 and a base body 322 connecting the connection end 321 and the bond pad end 323, wherein the connection end 321 is located within the end of each of the plated through hole 310 such that the conductive trace 320 can be electrically connected to the plated through hole 310, and the connection end 321 has a shape free from any angle, such as a round shape which prevents right angle from being formed to the periphery of the connection end 321. Meanwhile, the width D1 of the connection end 321 is greater than the width D3 of the base body 322, but not greater than the diameter D2 of the plated through hole 310 such that the connection end 321 is located within the area of the end of each of the plated through holes 310. The width D1 of the connection end 321 of the conductive trace 320 can be smaller or equal to the diameter D2 of the plated through hole 310. Preferably, the width D1 of the connection end 321 of the conductive trace 320 is smaller than the diameter D2 of the plated through hole 310.

Further, a solder mask layer 330 is formed on the first surface 301 and the second surface 302 of the core layer 300. The solder mask layer 330 can be a green paint made of epoxy resin, polyimide, cynate ester, glass fiber, BT (Bismaleimide Triazine) or FR5 which is a mixture of epoxy resin and glass fiber. Openings 331 are formed in the solder mask layer 330 to expose the bond pad ends 323 of the conductive traces 320 for subsequent mounting of solder balls.

Figure 3B:
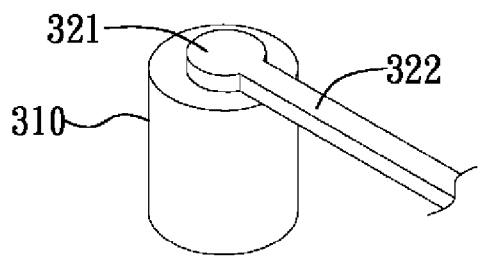
FIG. 3B is a perspective diagram of conductive trace and plated through hole of a package substrate having landless conductive traces according to the present invention.

Referring to FIG. 3B, since the width D1 of the connection end 321 of the conductive trace 320 is greater than the width D3 of the base body 322 and smaller than the diameter D2 of the plated through hole 310, the connection end 321 of the conductive trace 320 can be located within the area of the end of the plated through hole 310 and meanwhile the contact area between the conductive trace 320 and the plated through hole 310 is increased through the connection end 321, thereby preventing cracking of the contact surface of the conductive trace 320 with the plated through hole 310 caused by thermal stresses formed in a thermal cycling test (TCT) due to high temperature environment or great variation of temperature. This further prevents the separation of the conductive trace 320 from the plated through hole 310 and improves the product reliability. In the meantime, as the connection end 321 has a shape free from any angle, stress is prevented from being concentrated at corners as in the prior art.

Figure 3C:
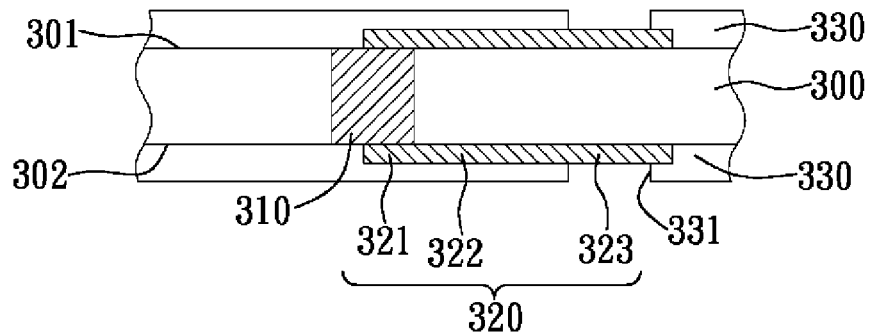
FIG. 3C is a diagram of a package substrate having landless conductive traces according to a second embodiment.

FIG. 3C is a diagram showing a package substrate having landless conductive traces according to a second embodiment of the present invention. The present embodiment is similar to the first embodiment, except that in the second embodiment a plurality of conductive traces 320 is further formed on the second surface 302 of the core layer 300 and electrically connected to the plated through holes 310.

Figure 3D:
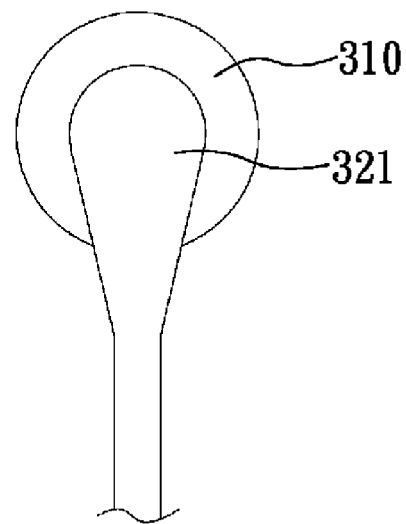
FIG. 3D is a diagram of a package substrate having landless conductive traces according to a third embodiment of the present invention.
Figure 3E:
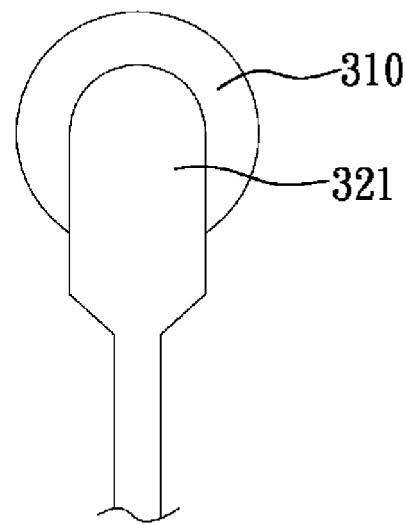
FIG. 3E is a diagram of a package substrate having landless conductive traces according to a fourth embodiment of the present invention.

FIGS. 3D and 3E are diagrams showing a package substrate having landless conductive traces according to a third and fourth embodiments of the present invention. The third and fourth embodiments are similar to the first embodiment, except that in the third and fourth embodiments the connection end 321 has a tear drop shape and an elliptic shape respectively such that the connection end 321 can form smoothly arc-shaped connection with the base body, thereby preventing stresses from being concentrated at corners as in the prior art.

Therefore, the process for fabricating the package substrate of the present invention mainly comprises forming at least one plated through hole in a core layer, and forming a plurality of conductive traces on at least a surface of the core layer, allowing each of the conductive traces to have a connection end, an opposed bond pad end, and a base body connecting the connection end and the bond pad end, with the connection end connected to the end of each of the plated through holes such that the conductive traces can be electrically connected to the plated through holes. Further, the connection end has a width greater than that of the base body but not greater than the diameter of the plated through hole so as to allow the connection end to be located within the area of the end of each of the plated through holes. Therefore, by the predetermined width and area relations between the conductive trace, the connection end of the conductive trace and the plated through hole, the contact area between the conductive trace and the plated through hole is increased, thereby preventing cracking of the contact surface of the conductive trace with the plated through hole caused by thermal stresses in a subsequent thermal cycling test (TCT) and further preventing the separation of the conductive trace from the plated through hole and increasing the product reliability. Meanwhile, as the connection end has a shape free from any angle, stress is prevented from being concentrated at corners as in the prior art.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A package substrate having landless conductive traces, at least comprising:
    a core layer having a first surface and a second surface, a plurality of conductive through holes being formed in the core layer and penetrating the first and second surfaces; and
    a plurality of conductive traces formed on the first surface of the core layer, wherein each of the conductive traces has a connection end, an opposed bond pad end formed on the first surface, and a base body formed on the first surface and connecting the connection end and the bond pad end, with the connection end being formed on an end surface of the conductive through hole corresponding to the first surface of the core layer such that the conductive trace can be electrically connected to the conductive through holes, and a width of the connection end is greater than that of the base body and smaller than a diameter of the conductive through hole.

2. The package substrate of claim 1, wherein the connection end has a shape free from any angle.

3. The package substrate of claim 2, wherein the connection end has a round shape.

4. The package substrate of claim 2, wherein the connection end has an elliptic shape.

5. The package substrate of claim 2, wherein the connection end has a tear drop shape.

6. The package substrate of claim 1, wherein the connection end forms smoothly arc-shaped connection with the base body.

7. The package substrate of claim 1, wherein a plurality of conductive traces are further formed on the second surface of the core layer and electrically connected to the conductive through holes.

8. The package substrate of claim 7, wherein each of the conductive traces has a connection end for electrically connecting a corresponding one of the conductive through holes, an opposed bond pad end and a base body connecting the connection end and the bond pad end.

9. The package substrate of claim 8, wherein the connection end has a shape free from any angle.

10. The package substrate of claim 1, wherein the conductive traces are made of a material selected from the group consisting of Cu, Sn, Ni, Cr, Ti, Cu—Cr alloy and Sn—Pb alloy.

11. The package substrate of claim 1, wherein the connection end is connected to an end of the corresponding one of the conductive through holes.

12. A package substrate having landless conductive traces, comprising:
    a core layer having a first surface and a second surface, a plurality of conductive through holes being formed in the core layer and penetrating the first and second surfaces; and
    a plurality of conductive traces formed on the first surface of the core layer, wherein each of the conductive traces has a connection end, an opposed bond pad end formed on the first surface, and a base body formed on the first surface and connecting the connection end and the bond pad end, with the connection end stacked on the conductive through holes such that the conductive trace can be electrically connected to the conductive through holes, and a width of the connection end is greater than that of the base body and smaller than a diameter of the conductive through hole.

* * * * *